US012782815B2

(12) United States Patent
Huotari et al.

(10) Patent No.: US 12,782,815 B2
(45) Date of Patent: Nov. 3, 2026

(54) METHOD OF FORMING A PHOTORESIST ABSORBER LAYER AND STRUCTURE INCLUDING SAME

(71) Applicant: ASM IP Holding B.V., Almere (NL)

(72) Inventors: Hannu Huotari, Helsinki (FI); Daniele Piumi, Etterbeek (BE); Yoann Tomczak, Leuven (BE); Ivan Zyulkov, Brussels (BE); Charles Dezelah, Helsinki (FI); Arpita Saha, Espoo (FI); David de Roest, Leuven (BE); Jerome Innocent, Leuven (BE); Michael Givens, Oud-Heverlee (BE); Monica Thukkaram, Ghent (BE)

(73) Assignee: ASM IP Holding B.V., Almere (NL)

( * ) Notice: Subject to any disclaimer, the term of this patent is extended or adjusted under 35 U.S.C. 154(b) by 610 days.

(21) Appl. No.: 17/900,578

(22) Filed: Aug. 31, 2022

(65) Prior Publication Data

US 2023/0091094 A1 Mar. 23, 2023

Related U.S. Application Data

(60) Provisional application No. 63/240,681, filed on Sep. 3, 2021.

(51) Int. Cl.

| | |
|---|---|
| ***G03F 7/11*** | (2006.01) |
| ***G03F 7/16*** | (2006.01) |
| ***G03F 7/20*** | (2006.01) |

(52) U.S. Cl.

CPC ................ *G03F 7/11* (2013.01); *G03F 7/167* (2013.01); *G03F 7/2004* (2013.01)

(58) Field of Classification Search

CPC ... G03F 1/54; G03F 7/11; G03F 7/167; G03F 7/2004; G03F 7/091

See application file for complete search history.

(56) References Cited

U.S. PATENT DOCUMENTS

| | | | |
|---|---|---|---|
| 8,968,989 | B2 | 3/2015 | Quattara |
| 9,425,059 | B2 | 8/2016 | Park |
| 9,535,332 | B2 | 1/2017 | Ruoff et al. |
| 9,929,012 | B1 | 3/2018 | Belyansky |
| 10,347,486 | B1 | 7/2019 | De Silva |
| 10,503,070 | B2 | 12/2019 | Zi et al. |
| 10,545,408 | B2 | 1/2020 | Ma et al. |
| 10,551,742 | B2 | 2/2020 | Xu |

(Continued)

FOREIGN PATENT DOCUMENTS

| | | | | |
|---|---|---|---|---|
| JP | 2017116931 A | | 6/2017 | |
| TW | 202113146 A | | 4/2021 | |
| WO | WO-2021067632 A2 | * | 4/2021 | ........... G03F 7/0042 |

OTHER PUBLICATIONS

Review of recent advances in inorganic photoresists, Chaoyun Luo, Chanchan Xu, Le Lv, Hai Li, Xiaoxi Huang, and Wei Liu, RSC Adv., 2020, 10, 8385-8395 (Year: 2020).*

*Primary Examiner* — Keith Walker
*Assistant Examiner* — Alexander N. Lee
(74) *Attorney, Agent, or Firm* — Snell & Wilmer L.L.P.

(57) ABSTRACT

Methods of forming structures including a photoresist absorber layer and structures including the photoresist absorber layer are disclosed. Exemplary methods include forming the photoresist absorber layer that includes at least two elements having an EUV cross section (σα) of greater than $2\times10^6$ $cm^2$/mol.

21 Claims, 9 Drawing Sheets

(56) References Cited

U.S. PATENT DOCUMENTS

| | | | | |
|---|---|---|---|---|
| 10,741,410 | B2 | 8/2020 | Zi et al. | |
| 10,782,606 | B2 | 9/2020 | Liang | |
| 10,998,191 | B2 | 5/2021 | Church | |
| 11,314,168 | B2 | 4/2022 | Tan | |
| 11,550,222 | B2 | 1/2023 | Singh | |
| 11,667,575 | B2 | 6/2023 | Wu et al. | |
| 2015/0064611 | A1* | 3/2015 | Shih | G03F 1/24 430/5 |
| 2016/0011500 | A1* | 1/2016 | Hassan | C23C 16/44 430/5 |
| 2019/0391494 | A1 | 12/2019 | Wojtecki | |
| 2020/0310244 | A1* | 10/2020 | Nakagawa | G03F 1/24 |
| 2021/0013037 | A1 | 1/2021 | Sun | |
| 2021/0375615 | A1 | 12/2021 | Krishtab | |
| 2021/0397085 | A1 | 12/2021 | Weidman | |
| 2022/0197147 | A1 | 6/2022 | Liang | |
| 2022/0342301 | A1 | 10/2022 | Weidman | |
| 2022/0365434 | A1 | 11/2022 | Nardi | |

* cited by examiner

METHOD OF FORMING A PHOTORESIST ABSORBER LAYER AND STRUCTURE INCLUDING SAME

CROSS-REFERENCE TO RELATED APPLICATIONS

This application claims priority to U.S. Provisional Patent Application Ser. No. 63/240,681 filed Sep. 3, 2021 titled METHOD OF FORMING A PHOTORESIST ABSORBER LAYER AND STRUCTURE INCLUDING SAME, the disclosure of which is hereby incorporated by reference in its entirety.

FIELD OF INVENTION

The present disclosure generally relates to structures and to methods used in the formation of devices. More particularly, the disclosure relates to structures including or formed using a photoresist absorber layer and to methods of forming such structures.

BACKGROUND OF THE DISCLOSURE

During the manufacture of electronic devices, fine patterns of features can be formed on a surface of a substrate by patterning the surface of the substrate and etching material from the substrate surface using, for example, gas-phase etching processes. As a density of devices on a substrate increases, it generally becomes increasingly desirable to form features with smaller dimensions.

Photoresist is often used to pattern a surface of a substrate prior to etching. A pattern can be formed in the photoresist by applying a layer of photoresist to a surface of the substrate, masking the surface of the photoresist, exposing the unmasked portions of the photoresist to radiation, such as ultraviolet light, developing the exposed or unexposed portions of the photoresist to remove a portion (e.g., the unmasked or masked portion) of the photoresist, while leaving a portion of the photoresist on the substrate surface.

Recently, techniques have been developed to use extreme ultraviolet (EUV) wavelengths to develop patterns having relatively small pattern features. One limitation of methods using EUV is the relatively low flux of EUV photons and the resultant long exposure times and/or the inadequate exposure of the photo-sensitive materials that are responsible for creating contrast between exposed and unexposed areas of the photoresist.

Accordingly, improved structures including a photoresist underlayer (e.g., an absorber layer) and methods of forming such structures are desired. Any discussion of problems and solutions set forth in this section has been included in this disclosure solely for the purpose of providing a context for the present disclosure and should not be taken as an admission that any or all of the discussion was known at the time the invention was made.

SUMMARY OF THE DISCLOSURE

Various embodiments of the present disclosure relate to structures including improved photoresist absorber layers (sometimes referred to as underlayers) and to methods of forming the layers and structures. While the ways in which various embodiments of the present disclosure address drawbacks of prior methods and structures are discussed in more detail below, in general, various embodiments of the disclosure provide structures that include a photoresist absorber layer with relatively high EUV sensitivity. The relatively high sensitivity allows for use of a relatively low dosage of EUV to obtain desired contrast between exposed and unexposed areas of the photoresist, which, in turn, allows for the formation of features with desired properties, such as small critical dimensions, which can be formed in a relatively cost-effective manner. In addition, only needing a relatively low dosage of EUV advantageously allows reducing exposure times, thereby increasing throughput of EUV exposures.

Exemplary EUV absorber layers include two or more elements with relatively high EUV absorption (e.g., on a per mol basis). Such absorber layers can be stand alone or part of an underlayer film stack. Use of such absorber layers can provide desired patterned features during EUV photoresist patterning, using relatively low EUV dosage during a step of exposing the photoresist to EUV radiation. Exemplary photoresist absorber layers can be formed using a cyclical process, such as atomic layer deposition or plasma-enhanced atomic layer deposition, which allows for precise control of a thickness of the photoresist absorber layer—both on a surface of a substrate and from substrate to substrate.

In accordance with exemplary embodiments of the disclosure, a method of forming an extreme ultraviolet (EUV) absorber layer on a surface of a substrate is provided. An exemplary method includes providing a substrate within a reaction space of a gas-phase reactor, providing a precursor to the reaction space, providing a reactant to the reaction space, and forming an absorber layer on a surface of the substrate within the reaction space, the absorber layer comprising at least two elements having an EUV cross section ($\sigma\alpha$) of greater than $2\times10^6$ cm$^2$/mol. In some cases, the EUV cross section ($\sigma\alpha$) of the two or more elements is greater than an EUV cross section ($\sigma\alpha$) of oxygen. In some cases, at least one of the at least two elements has an EUV cross section ($\sigma\alpha$) of greater than $1\times10^7$ cm$^2$/mol. In accordance with examples of the disclosure, the reactant comprises a halogen, such as one or more of F, Cl, Br, and I. The absorber layer can include a metal halide. The metal can include a transition metal. In some cases, the metal can include a lanthanide. The halide can include F, Cl, Br, and/or I. Particular examples include a metal iodide or a metal fluoride (e.g., one or more of $PbI_2$, $PbF_2$, CsI, CsF, $BiF_3$, $BiI_3$, $InF_3$, $AlF_3$, $MgF_2$, $TiF_3$, $YF_3$, $LaF_3$, $SrF_2$, $TbF_3$, $YbF_2$, $YbF_3$, $YbI_2$, $YbI_3$, and $HfF_4$). In accordance with further examples, the absorber layer includes two or more elements selected from the group consisting of I, Te, Cs, Sb, Sn, In, Bi, Ag, Pb, Au, Pt, Yb, and Ir. In some cases, the absorber layer comprises material represented by the formula $MN_x$, where M is selected from one or more of Sb, Sn, In, Bi, Ag, Pt, Ir, Pb, Au, Yb, and Cs; where N is selected from one or more of I, Te, and Sb; and where x ranges from 0.1-4, 1-2, 0.1-0.2, 0.2-0.5, 0.5-1, 1-2, or 2-4. In some cases, x is greater than 0 and less than 0.25. In some cases, x is less than 1 and greater than 0.25. Such compositions may or may not be stoichiometric. In accordance with further examples of the disclosure, a method includes forming a capping layer overlying the absorber layer. Exemplary capping layers can be or include, for example, SiOC, amorphous carbon or a metal oxycarbide ($M_xO_yC_z$, where M can include one or more of a transition metal, a rare earth metal, a post transition metal or a metalloid, and where x=0.5-1, y=0.1-3, and z=0.1-2).

In accordance with further examples of the disclosure, structures suitable for forming patterned features using extreme ultraviolet (EUV) radiation are provided. The structures include a substrate and an absorber layer formed overlying the substrate. The absorber layer can be formed using a method as described herein. In accordance with various examples, the absorber layer comprises at least two elements having an EUV cross section (σα) of greater than $2\times10^6$ $cm^2$/mol. In some cases, the EUV cross section (σα) of the two or more elements is greater than an EUV cross section (σα) of oxygen. The two or more elements may form absorber layers having a relatively high density—e.g., greater than a density of tin oxide. In some cases, at least one of the at least two elements has an EUV cross section (σα) of greater than 1×10' $cm^2$/mol. In some cases, the absorber layer comprises a metal halide (e.g., one or more of a metal iodide and a metal fluoride). In accordance with further examples, the absorber layer comprises a material represented by the formula $MN_x$, where M is selected from one or more of Sb, Sn, In, Bi, Ag, Pt, Ir, Pb, Au, Yb, and Cs; where N is selected from one or more of I, F, CI, O, C, Te, B, As; and where x ranges from 0.1-4, 1-2, 0.1-0.2, 0.2-0.5, 0.5-1, 1-2, or 2-4. In some cases, x is greater than 0 and less than 0.25. In some cases, x is less than 1 and greater than 0.25.

In accordance with further examples of the disclosure, a system is provided. The system can be used to perform a method described herein and/or to form a structure as described herein.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 6:
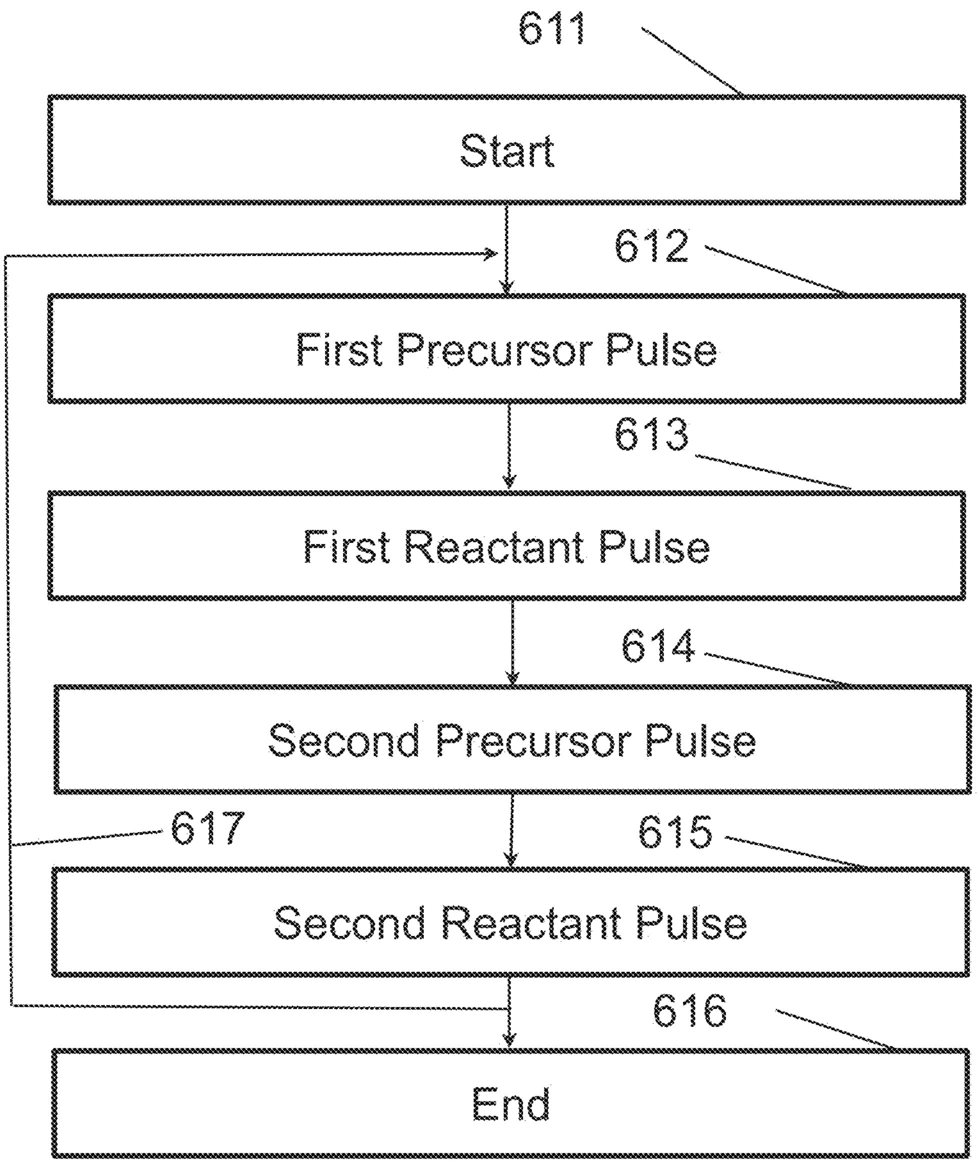

FIG. 6. Schematically shows a process flow of an embodiment of a method as described herein for making an absorber layer.

Figure 7:
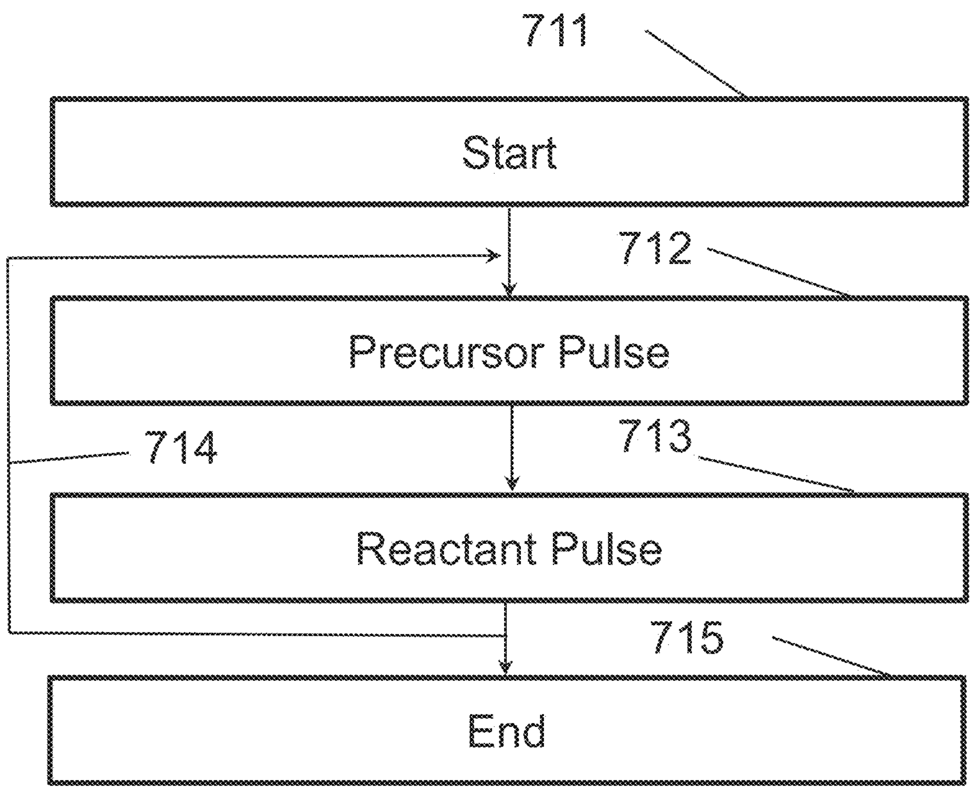

FIG. 7 shows another embodiment of a method for making an absorber layer, as described herein.

Figure 8:
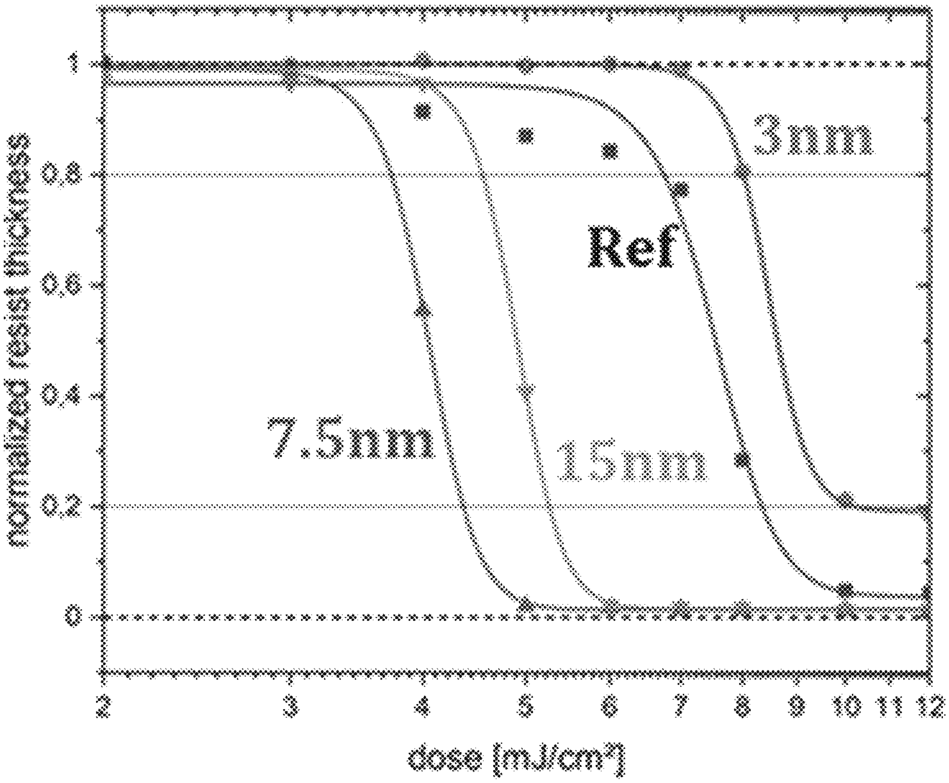
Figure 9:
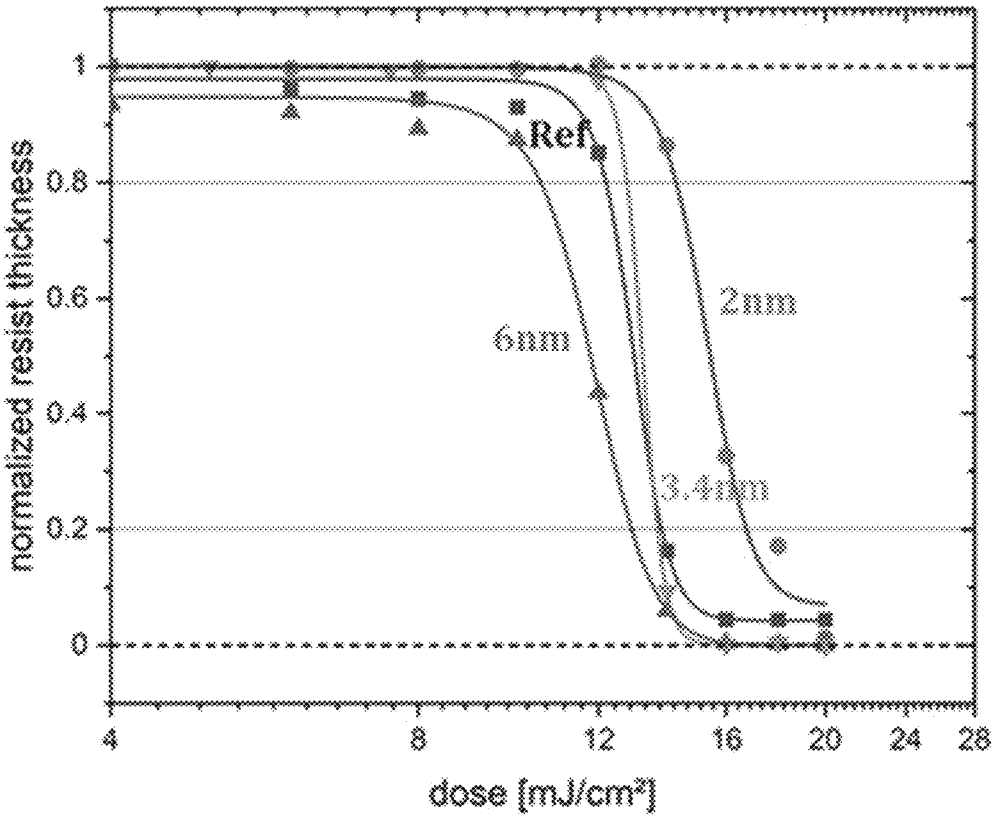

FIGS. 8 and 9 show experimental contrast curves for samples having several thicknesses.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of the present invention provided below is merely exemplary and is intended for purposes of illustration only; the following description is not intended to limit the scope of the invention disclosed herein. Moreover, recitation of multiple embodiments having stated features is not intended to exclude other embodiments having additional features or other embodiments incorporating different combinations of the stated features.

The present disclosure generally relates to methods of forming structures that include an extreme ultraviolet (EUV) absorber layer and to structures including the EUV absorber layer. Exemplary methods can be used to form structures with underlayers (absorber layers) with increased EUV sensitivity, which can result in lower EUV dosages used during photoresist exposure steps. The methods can be used to form structures with EUV absorber layers that allow for formation of patterned features with desired properties, such as small critical dimensions, reduced tapering and/or reduced roughness, compared to photoresist features formed using typical EUV photolithography techniques. Thus, methods described herein can provide for increased throughput of the manufacture of structures, reduced costs associated with the formation of the structures and/or devices formed using the structures, and/or a reduction of critical dimensions of features formed using the absorber layer and the photoresist layer.

As used herein, the term substrate may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application. Further, the substrate can additionally or alternatively include various features, such as recesses, lines, and the like formed within or on at least a portion of a layer of the substrate.

In some embodiments, film refers to a layer extending in a direction perpendicular to a thickness direction. In some embodiments, layer refers to a material having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. Further, a layer or film can be continuous or discontinuous.

In this disclosure, gas may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a rare gas.

In some cases, such as in the context of deposition of material, the term precursor can refer to a compound or compounds that participates in the chemical reaction that produces another compound, and particularly to a compound that constitutes a film matrix or a main skeleton of a film, whereas the term reactant can refer to a compound, in some cases other than precursors, that reacts with the precursor, activates the precursor, modifies the precursor, or catalyzes a reaction of the precursor; a reactant may provide an element (e.g., a halide) to a film and become a part of the film. In some cases, the terms precursor and reactant can be used interchangeably. The term inert gas refers to a gas that does not take part in a chemical reaction to an appreciable extent and/or a gas that excites a precursor when, for example, RF or microwave power is applied, but unlike a reactant, it may not become a part of a film matrix to an appreciable extent.

The term cyclic deposition process or cyclical deposition process may refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term atomic layer deposition may refer to a vapor deposition process in which deposition cycles, typically a plurality of consecutive deposition cycles, are conducted in a process chamber. The term atomic layer deposition, as used herein, is meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term purge or purging may refer to a procedure in which an inert or substantially inert gas is provided to a reactor chamber in between pulses of other (e.g., reactant or precursor) gases. For example, a purge may be provided between a precursor pulse and a reactant pulse, thus avoiding or at least reducing gas phase interactions between the precursor and the reactant. It shall be understood that a purge can be effected either in time or in space or both. For example, in the case of temporal purges, a purge step can be used, e.g., in the temporal sequence of providing a precursor to a reactor chamber, providing a purge gas to the reactor chamber, and providing a reactant to the reactor chamber, wherein the substrate on which a layer is deposited does not move. In the case of spatial purges, a purge step can take the form of moving a substrate from a first location to which a precursor is supplied, through a purge gas curtain, to a second location to which a reactant is supplied.

In this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, etc. in some embodiments. Further, in this disclosure, the terms including, constituted by and having can refer independently to typically or broadly comprising, comprising, consisting essentially of, or consisting of in some embodiments. Further, the term comprising can include consisting of or consisting essentially of. In accordance with aspects of the disclosure, any defined meanings of terms do not necessarily exclude ordinary and customary meanings of the terms.

Figure 1:
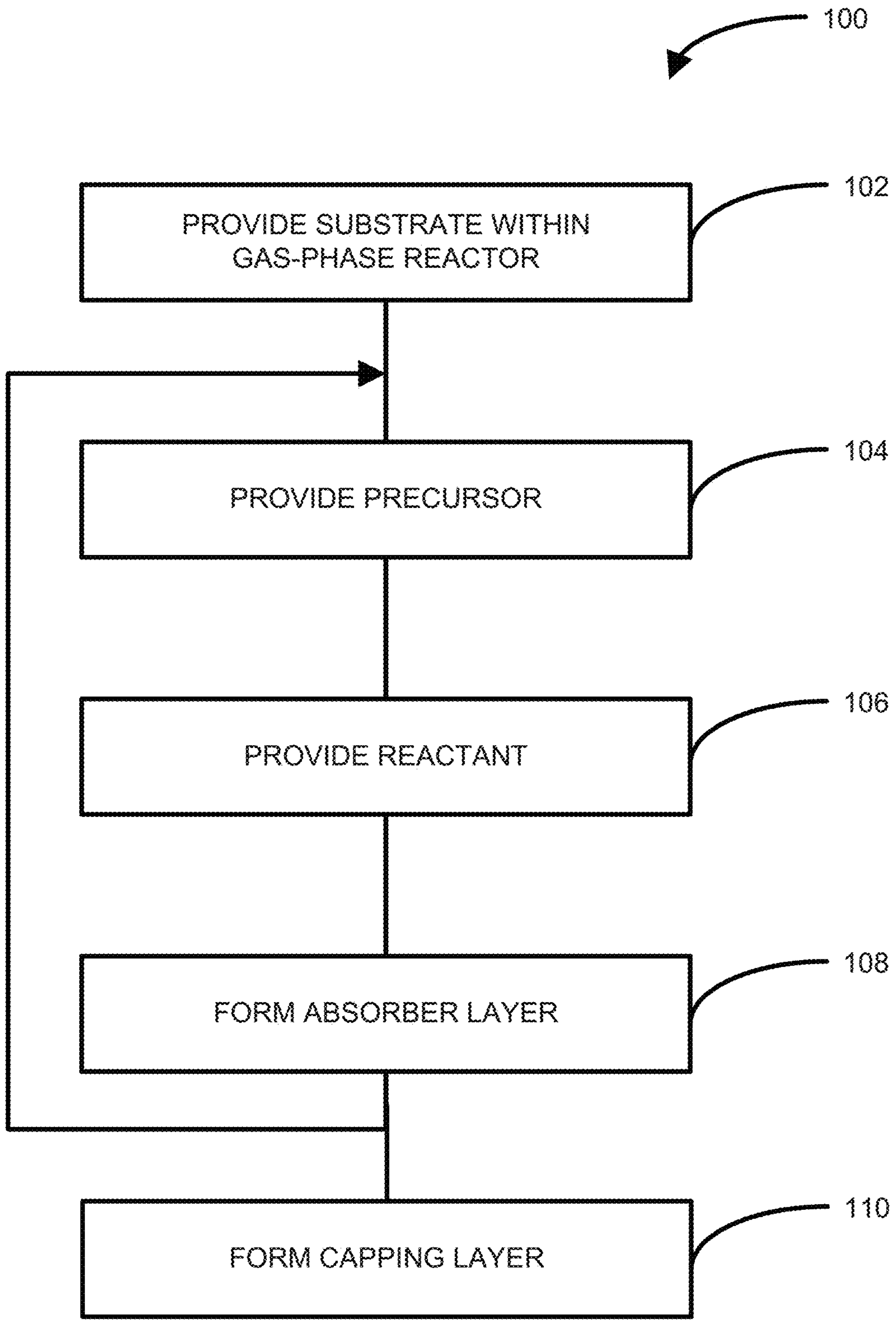
FIG. 1 illustrates a method in accordance with exemplary embodiments of the disclosure.

Turning now to the figures, FIG. 1 illustrates a method 100 in accordance with exemplary embodiments of the disclosure. Method 100 can be used for forming an extreme ultraviolet (EUV) absorber layer on a surface of a substrate. Method 100 includes the steps of providing a substrate within a reaction space of a gas-phase reactor (step 102), providing a precursor to the reaction space (step 104), providing a reactant to the reaction space (step 106), and forming an absorber layer (step 108). Method 100 can also include a step of forming a capping layer (step 110). Exemplary methods can be or include cyclical deposition methods, such as ALD methods.

Step 102 includes providing a substrate, such as a substrate described herein, within a reaction space of a gas-phase reactor. The substrate can include one or more layers, including one or more material layers, to be etched. By way of examples, the substrate can include a deposited oxide, a native oxide, or an amorphous carbon layer to be etched. The substrate can include several layers underlying the material layer(s) to be etched.

During step 104, a precursor is provided to the reaction space. Exemplary precursors can include one or more (e.g., two or more) (e.g., one or more metallic) elements with a relatively high EUV cross section ($\sigma\alpha$) greater than $2\times10^6$ $cm^2/mol$ and/or at least one element with an EUV cross section ($\sigma\alpha$) greater than $1\times10^7$ $cm^2/mol$. For example, the precursor can include one or more of Pb, Cs, Bi, In, Al, Mg, Ti, Y, La, Sr, Tb, Hf, Yb, or the like. The precursors can be a metal halide or an organic compound (e.g., an alkyl or alkoxide), an alkyl-silyl compound, amine compounds (e.g., alkyl amine compounds), or the like. In some cases, the organic compound can be a metal organic compound, an organometallic compound, or the like. In some cases, the organic compound can be or include a metal beta-diketonate compound, a metal cyclopentadienyl compound, a metal alkoxide compound, a metal dialkylamido compound, or the like.

In some embodiments, the metal precursor comprises an alkylamine ligand. In some embodiments, the metal precursor comprises an alkoxide ligand. In some embodiments, the metal precursor comprises an unsubstituted or an alkyl-substituted cyclopentadienyl ligand. In some embodiments, the metal precursor comprises a metal-halide bond.

In some cases, the metal precursor comprises an alkylamido compound. Exemplary metal alkylamido compounds include a metal center and one or more independently selected (e.g., C1-C4) alkyl amine ligands. Particular examples include $M(NMe_2)_4$, $M(NEt_2)_4$, and $M(NEtMe)_4$.

Exemplary metal alkoxide compounds include $M(OMe)_4$, $M(OEt)_4$, $M(OiPr)_4$, $M(OtBu)_4$, $MO(OMe)_3$, $MO(OEt)_3$, $MO(OiPr)_3$, and $MO(OtBu)_3$. Additional metal alkoxide compounds include variations of these compounds, where other alkoxy ligands are used.

Exemplary metal cyclopentadienyl compounds include $MCp_2Cl_2$, $MCp_2$, and $MCp_2(CO)_4$. Additional exemplary cyclopentadienyl compounds include variations of these compounds, where Cp is either unsubstituted or bearing one or more alkyl groups, e.g., MeCp, EtCp, iPrCp, and the like.

By way of particular examples, the precursor can include one or more of a metal halide, such as a Pb halide (e.g., $PbF_2$), a Sb halide (e.g., $SbCl_3$), a Bi halide (e.g., $BiCl_3$, $BiF_3$, $BiI_3$), an indium halide (e.g., $InF_3$, $InCl_3$); a metal silylamide, e.g., a metal bis(trimethylsilyl)amide (btsa) (e.g., Pb-silylamide (e.g., $Pb(btsa)_2$)), a Bi-silylamide (e.g., $Bi(btsa)_2$); a metal trimethylsily precursor (e.g., $Te(TMS)_2$); a metal alkoxide (e.g., cesium tert-butoxide (CsO$^t$Bu), a Bi-alkoxide, antimony(III) ethoxide ($Sb(OEt)_3$); a metal amine or amino precursor, such as $Bi(NMe_2)_3$, Bi(NEtMe) $_3$), $Sb(NMe_2)_3$, $Pb[N(SiMe_3)_2]_2$; a metal cyclopentadienyl precursor (e.g., InCp); an alkyl metal precursor, such as trimethylindium (TMI), triethylindium (TEI), or the like. Additional exemplary precursors are set forth below in Tables 1 and 2.

By way of additional examples, a metal alkylsilylamide or metal silylamide compound can be represented by the general formula (i), where R1-R6 are each independently selected from a C1-C4 alkyl group.

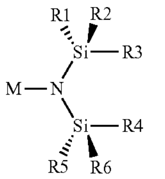

(i)

A temperature within a reaction space during step 104 can be, for example, between about 20° C. and about 200° C., about 50° C. to about 500° C., about 100° C. to about 600° C., or about 300° C. to about 500° C. A pressure within the reaction chamber during step 104 can be about 10 Pa to about 7000 Pa or about 140 Pa to about 1300 Pa or about 100 to about $10^8$ Pa, about 10 to about $10^7$ Pa, about 100 to about $5\times10^6$ Pa, about $10^3$ to about $10^6$ Pa, about 0.001 to $10^6$ Pa, or from vacuum to about $2\times10^6$ Pa, or about 10 Pa to about $10^6$ Pa, or about 100 Pa to about $10^6$ Pa. A flowrate of the precursor can be between about 200 to about 2000 sccm. A duration of a pulse of introducing the precursor to the reaction chamber can be between about 0.1 and about 30 seconds, about 0.1 and about 15 seconds, about 0.01 seconds and about 60 seconds, about 0.05 seconds and about 10 seconds, or about 0.1 seconds and about 5.0 seconds. In addition, during the pulsing of precursor within the reaction chamber, the flowrate of the precursor may be less than 2000 sccm, or less than 500 sccm, or even less than 100 sccm, or be from about 1 to about 2000 sccm, from about 5 to about 1000 sccm, or from about 10 to about 500 sccm.

During step 106, a reactant is provided to the reaction space. In accordance with examples of the disclosure, the reactant includes a halide, such as one or more of F, Cl, Br, and I. Particular exemplary halides suitable for use as a reactant include HF, $TiF_4$, $SnI_4$, $CH_2I_2$, HI, $I_2$, and the like. In some cases, another precursor can be a reactant. In such cases, the reactant can include any of the precursors noted above. Yet additional exemplary reactants are set forth in the tables.

A temperature and pressure within the reaction chamber during step 106 can be the same or similar to the temperature and/or pressure noted above in connection with step 104. A flowrate of the reactant can be between about 100 and about 2000 sccm or a flowrate noted above in connection with step 104. A duration of a pulse of introducing the reactant to the reaction chamber can be between about 0.1 and about 30 seconds or a pulse duration, as noted above in connection with step 104. As illustrated in FIG. 1, steps 104 and 106 can be repeated one or more times to form the absorber layer (step 108).

Various combinations of precursors and corresponding reactants suitable for use in steps 104 and 106 can be used to form the absorber layer. For example, in some cases, the absorber layer includes a halide, such as a metal halide comprising one or more of F, Cl, Br, and I (e.g., F or I). Solid halides of metals, such as metals noted herein, can provide better cross-sectional absorbance of EUV radiation, in which both the metal and the non-metal (halide) provide relatively high cross-sectional absorbance, compared to typical absorber layers. In some cases, increased absorbance is achieved by an increased number of halides per mole and/or the halide providing increased absorbance compared to other materials.

Generally, the absorber layer is desirably a thermally and chemically stable solid. In some cases, as described in more detail below, a capping layer or a sandwich configuration can be used to provide additional stability to the absorber layer. In some cases, the metal halide can be incorporated as a mixture on a matrix of other materials to, for example, form a solid halide mixture with an oxide. In addition, it may be desirable to etch or strip the absorber layer from the substrate surface. Therefore, the absorber layer may desirably include material that can form soluble or volatile compounds when reacted with an etchant.

When the absorber layer comprises a halide, the reactant can include a halogen (e.g., selected from the group consisting of F, Cl, Br, and I). Table 1 illustrates exemplary precursors and halide reactants for forming an absorber layer including a metal halide. These examples are meant to be illustrative and not limiting.

In the table below and elsewhere herein, the following abbreviations are used: M stands for metal, OAc stands for acetyloxy, Cp stands for cyclopentadienyl, MeCp stands for methylcyclopentadienyl, EtCp stands for ethylcyclopentadienyl, iPrCp stands for isopropylcyclopentadienyl, Me stands for methyl; Et stands for ethyl; iPr stands for isopropyl; O$^t$Bu stands for tert-butyllester; hfac stands for hexafluoroacetylacetonate; and thd stands for 2,2,6,6-tetra methyl hepta ne-3,5-dionate.

TABLE 1

| Exemplary Precursors | Exemplary Reactants | Absorber Layer Material |
|---|---|---|
| $PbF_2$, Pb-silylamide | HF, $TiF_4$ | $PbF_2$ |
| CsO$^t$Bu | $SnI_4$, HI | CsI |
| CsO$^t$Bu | HF, $TiF_4$ | CsF |
| $BiF_3$, Bi-silylamide/Bi-alkoxide | HF, $TiF_4$ | $BiF_3$ |
| Bi-silylamide/Bi-alkoxide | $SnI_4$, HI | $BiI_3$ |
| $InCl_3$/InCp/TMI/TEI | HF, $TiF_4$ | $InF_3$ |
| $Mg(EtCp)_2$, $Mg(thd)_2$ | HF, $TiF_4$, $TaF_5$, $O_3$, and Hhfac | $MgF_2$ |
| $Al(NMe_2)_3$ | HF | $AlF_3$ |
| $AlCl_3$ | $TiF_4$ | |
| $AlMe_3$ | HF | |
| $AlMe_3$ | $TaF_5$ | |
| $AlMe_3$ | $Sf_6$ plasma | |
| $AlMe_3$ | $H_2O$ and HF | $AlO_xF_y$ |
| $WF_6$ | $AlMe_3$ | $AlW_xF_y$ |
| LiO$^t$Bu | $AlCl_3$ and $TiF_4$ | $LiA_xF_y$ |
| $Ca(hfac)_2$ | $O_3$ | $CaF_2$ |
| $Ca(thd)_2$ | HF | |
| $Ca(thd)_2$ | $TiF_4$ | |
| $Ca(thd)_2$ | $O_3$ and Hhfac | |

TABLE 1-continued

| Exemplary Precursors | Exemplary Reactants | Absorber Layer Material |
|---|---|---|
| $Mn(EtCp)_2$ | HF | $MnF_2$ |
| $Zn(OAc)_2$ | HF | $ZnF_2$ |
| $ZnEt_2$ | | |
| $ZnEt_2$ | HF and $H_2O$ | $ZnO_xF_y$ |
| $Sr(thd)_2$ | HF | $SrF_2$ |
| $Y(thd)_3$ | $TiF_4$ | $YF_3$ |
| $Zr(NEtMe)_4$ | HF | $ZrF_4$ |
| $Zr(O^tBu)_4$ | | |
| $La(thd)_3$ | $TiF_4$ | $LaF_3$ |
| $La(thd)_3$ | $O_3$ and Hhfac | |
| $Tb(thd)_3$ | $TiF_4$ | $TbF_3$ |
| $Hf(NEtMe)_4$ | HF | $HfF_4$ |

In some cases, the absorber layer comprises two or more elements selected from the group consisting of I, Te, Cs, Sb, Sn, In, Bi, Ag, Pb, Au, Pt, Yb, and Ir. In accordance with other examples, the absorber layer comprises material represented by the formula MNx, where M is selected from one or more of Sb, Sn, In, Bi, Ag, Pt, Ir, Pb, Au, Yb, and Cs; where N is selected from one or more of I, Te, and Sb; and where x ranges from 0.1 to 4, 1-2, 0.1-0.2, 0.2-0.5, 0.5-1, 1-2, or 2-4. In some cases, x is greater than 0 and less than 0.25. In some cases, x is less than 1 and greater than 0.25. Particular examples include one or more of $Sb_2Te_3$, $PbI_2$, InSb, CdTe, $Bi_2Te_3$, and CsI.

Table 2 below provides exemplary precursors and reactants for steps 104 and 106 for such absorber layers. Again, the examples are merely illustrative and not restrictive.

TABLE 2

| Exemplary Precursors | Exemplary Reactants | Absorber Layer Material |
|---|---|---|
| $SbCl_3$, $Sb(OEt)_3$, $Sb(NMe_2)_3$ | $Te(TMS)_2$ | $Sb_2Te_3$ |
| $Pb[N(SiMe_3)_2]_2$ | $SnI_4$ | $PbI_2$ |
| $BiCl_3$, $Bi(NMe_2)_3$, $Bi(NMe_2)_3$ | $Te(TMS)_2$ | $Bi_2Te_3$ |
| $Cs(O^tBu)$ | $SnI_4$ | CsI |

The absorber layers which are described herein may, for example, be deposited using a thermal cyclical (e.g., ALD) or a thermal CVD method. Alternatively, the absorber layers that are described herein may be deposited using cyclical plasma (e.g., plasma ALD) or plasma pulsed-CVD—e.g., by activating (directly or remotely) a reactant and/or precursor. Both approaches may suitably provide for the deposition of thin 5 nm) absorber layers with low non-uniformity.

In accordance with examples of the disclosure, the absorber layer includes at least two elements (e.g., a metal and a halide) having an EUV cross section (σα) of greater than $2\times10^6$ $cm^2$/mol. In some cases, the EUV cross section (σα) of the at least two elements is greater than an EUV cross section (σα) of oxygen. In some cases, at least one of the at least two elements has an EUV cross section (σα) of greater than $1\times10^7$ $cm^2$/mol. The absorber layer may suitably include additional elements, such as additional metals or oxygen.

Particular examples of materials suitable for the absorber layer are provided above. A thickness of the absorber layer formed during step 104 can be less than 10 nm or less than 5 nm.

As illustrated in FIG. 1, once a desired thickness of the absorber layer is obtained, an optional capping layer can be formed over the absorber layer (e.g., in direct contact with the absorber layer) during step 110. The capping layer can be formed using a suitable (e.g., cyclical) deposition process. By way of example, the capping layer can be or include one or more of SiOC, amorphous carbon or a metal oxycarbide (e.g., represented by $M_xO_yC_z$, wherein M can comprise one or more of a transition metal, a rare earth metal, a post transition metal or a metalloid, for example, a metal selected from one or more of Ti, V, Fe, Cu, Co, Al, W, Mo, Cs, Sb, Sn, In, Bi, Pb, and Yb, where x=0.5-1, y=0.1-3, and z=0.1-2). The capping layer can be formed using, for example, an ALD process.

Figure 2:
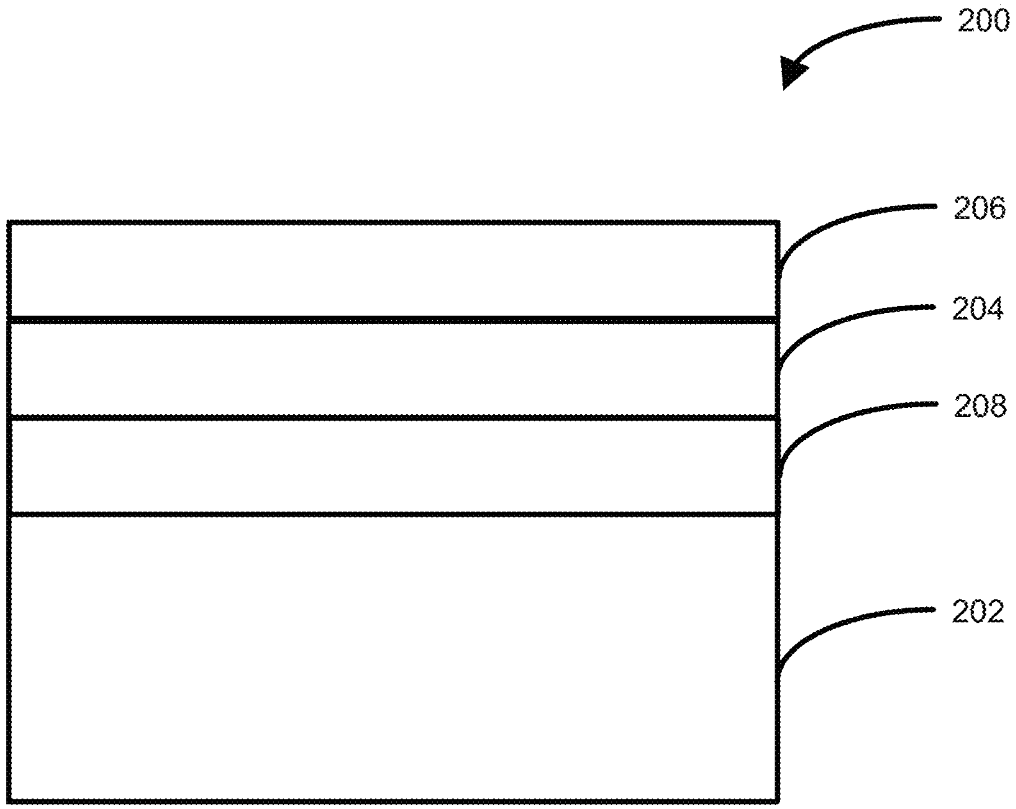
FIG. 2 illustrates a structure in accordance with exemplary embodiments of the disclosure.

FIG. 2 illustrates a structure 200 in accordance with exemplary embodiments of the disclosure. Structure 200 can be formed using, for example, method 100.

As illustrated, structure 200 includes a substrate 202, an absorber layer 204, and optionally one or more of a material layer 208, and a capping layer 206. Material layer 208 and capping layer 206 can be used to provide desired stability to absorber layer 204 and/or for other reasons.

Substrate 202 can include a substrate as described above. By way of examples, substrate 202 can include a semiconductor substrate and can include one or more layers. Further, as noted above, substrate 202 can include various topologies, such as recesses, lines, and the like formed within or on at least a portion of a layer of the substrate.

Absorber layer 204 can include an absorber layer formed in accordance with a method described herein (e.g., method 100) and/or comprise absorber material as described herein and/or have properties as described herein. A thickness of absorber layer 204 can depend on a composition of absorber layer 204, a thickness of and/or composition of material layer 208, a thickness of and/or composition of capping layer 206, a type of photoresist, and the like. In accordance with examples of the disclosure, absorber layer 204 has a thickness of less than 10 nm or less than or about 5 nm.

Material layer 208 can be formed of, for example, metals, semiconductors, and their alloys, oxides, nitrides, and carbides as well. By way of examples, material layer 208 can include a hard mask material, such as amorphous carbon. In some cases, material layer 208 can include a material noted herein in connection with a capping layer. A thickness of material layer 208 can be from about 0.1 to about 10 nm. Capping layer 206 can be formed of, for example, SiOC, amorphous carbon or $M_xO_yC_z$, as described above. A thickness of capping layer 206 can be from about 0.1 to about 10 nm.

Figure 3:
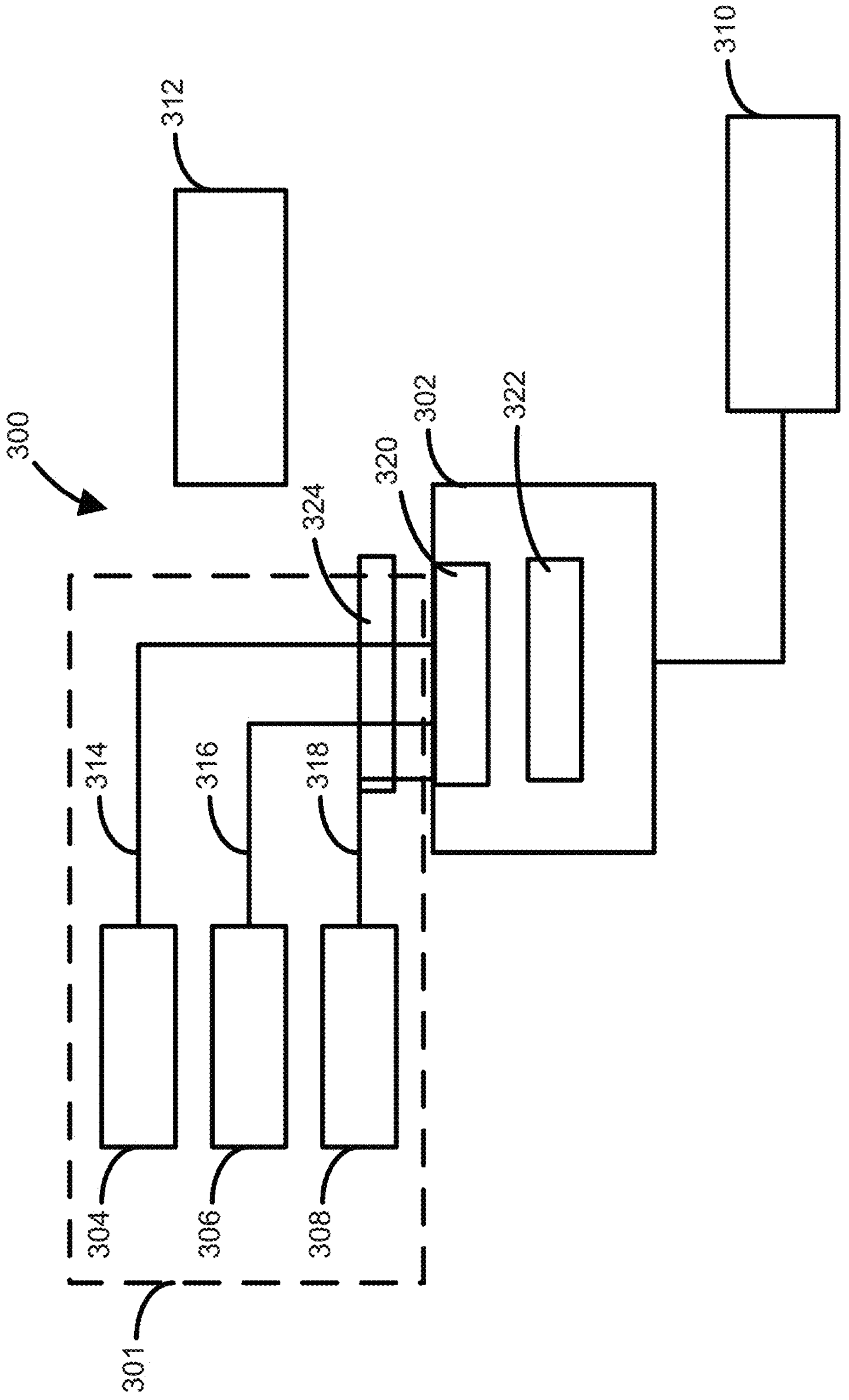
FIG. 3 illustrates a system configured for executing a method as described herein.

FIG. 3 schematically illustrates a system 300 in accordance with examples of the disclosure. System 300 can be used to perform a method as described herein and/or to form a structure or a portion thereof as described herein.

In the illustrated example, system 300 includes one or more reaction chambers 302, a precursor injector system 301, a metal precursor vessel 304, a reactant vessel 306, an auxiliary reactant source 308, an exhaust source 310, and a controller 312. System 300 may include one or more additional gas sources (not shown), such as an inert gas source, a carrier gas source and/or a purge gas source.

Reaction chamber 302 can include any suitable reaction chamber, such as an ALD or CVD reaction chamber as described herein.

Metal precursor vessel 304 can include a vessel and one or more metal precursors as described herein—alone or mixed with one or more carrier (e.g., inert) gases. Reactant source vessel 306 can include a vessel and one or more reactants (e.g., halide reactants) as described herein—alone or mixed with one or more carrier gases. Auxiliary reactant source 308 can include an auxiliary reactant, or a precursor as described herein. Although illustrated with three source vessels 304-308, system 300 can include any suitable number of source vessels. Source vessels 304-308 can be coupled to reaction chamber 302 via lines 314-318, which can each include flow controllers, valves, heaters, and the like. In some embodiments, a vessel is heated so that a precursor or a reactant reaches a desired temperature. Each vessel may be heated to a different temperature, according to the precursor or reactant properties, such as thermal stability and volatility.

Exhaust source 310 can include one or more vacuum pumps.

Controller 312 includes electronic circuitry and software to selectively operate valves, manifolds, heaters, pumps and other components included in system 300. Such circuitry and components operate to introduce precursors, reactants and purge gases from the respective sources. Controller 312 can control timing of gas pulse sequences, temperature of the substrate and/or reaction chamber 302, pressure within the reaction chamber 302, and various other operations to provide proper operation of the deposition assembly 300. Controller 312 can include control software to electrically or pneumatically control valves to control flow of precursors, reactants and purge gases into and out of the reaction chamber 302. Controller 312 can include modules, such as a software or hardware component, which perform certain tasks. A module may be configured to reside on the addressable storage medium of the control system and be configured to execute one or more processes.

In the illustrated example, system 300 also includes a gas distribution assembly (e.g., a showerhead) 320 and a susceptor 322 (which can include an electrode and/or a heater). In accordance with some examples of the disclosure, system 300 can also include a remote plasma unit 324 to activate one or more reactants, precursors, and/or inert gases.

Other configurations of system 300 are possible, including different numbers and kinds of precursor and reactant sources. Further, it will be appreciated that there are many arrangements of valves, conduits, precursor sources, and auxiliary reactant sources that may be used to accomplish the goal of selectively and in a coordinated manner feeding gases into reaction chamber 302. Further, as a schematic representation of a deposition system, many components have been omitted for simplicity of illustration, and such components may include, for example, various valves, manifolds, purifiers, heaters, containers, vents, and/or bypasses.

During operation of deposition assembly 300, substrates, such as semiconductor wafers (not illustrated), are transferred from, e.g., a substrate handling system to reaction chamber 302. Once substrate(s) are transferred to reaction chamber 302, one or more gases from gas sources, such as precursors, reactants, carrier gases, and/or purge gases, are introduced into reaction chamber 302. In some embodiments, the precursor is supplied in pulses, the reactant is supplied in pulses and the reaction chamber is purged between consecutive pulses of precursor and reactant.

Figure 4:
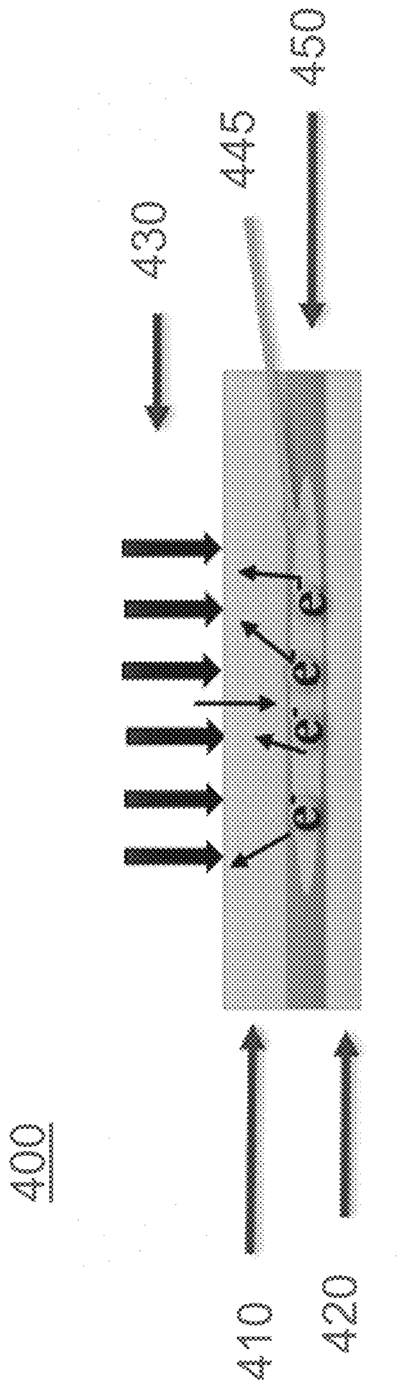
FIG. 4 illustrates a structure according to an embodiment as described herein.

FIG. 4 schematically shows an embodiment of a structure (400) that can be formed using an embodiment of a method as described herein. The structure (400) comprises a substrate (420). An EUV absorber layer (450) is located overlying the substrate (420). An EUV resist (410) is located overlying the EUV absorber layer (450). In other words, the EUV absorber layer (450) is positioned between the substrate (420) and the EUV resist (410). When the substrate (420) is irradiated with EUV radiation (430), secondary electrons (445) are generated in the EUV absorber layer (450). A part of these secondary electrons (445) reach the EUV resist (410), where they cause chemical changes. Thus, by applying EUV radiation (430) to a structure (400), a pattern can be formed, which can be transferred in the substrate (420) using, for example, an etch. It shall be understood that suitable EUV resists (410) are known as such.

It shall be understood that "EUV resist" refers to a layer that undergoes chemical changes, such as a change in etch rate in a pre-determined developer such as tetramethyl ammonium hydroxide, when exposed to secondary electrons that are generated in an EUV absorber layer. Conversely, an EUV absorber layer does not undergo any substantial etch rate change in a pre-determined developer.

Figure 5:
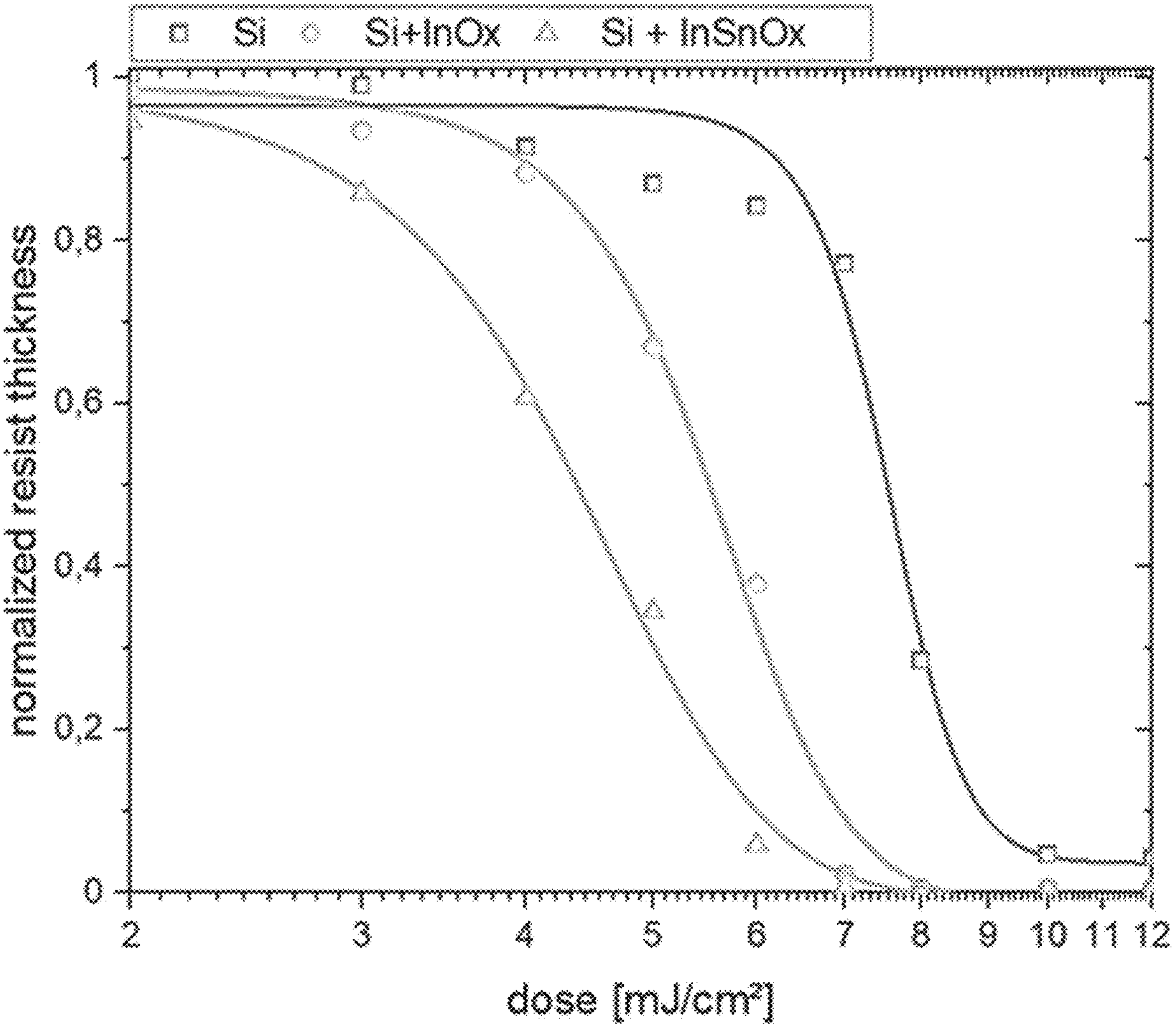
FIG. 5 shows experimental results, in particular saturation curves, obtained on samples comprising a structure as shown in FIG. 4.

FIG. 5 shows experimental results, in particular saturation curves, obtained on samples comprising a structure as shown in FIG. 4. A saturation curve as shown in FIG. 5 shows the remaining resist thickness (without development) as a function of EUV exposure energy dose. The thickness decreases due to densification of resist by cross-linking on EUV illumination. Saturation curves are shown for three samples: a sample without any EUV absorber layer, denoted "Si"; a sample comprising an indium oxide EUV absorber layer, denoted "InOx"; and a sample comprising an indium tin oxide EUV absorber layer, i.e. an EUV absorber layer substantially consisting of indium, tin, and oxygen. In particular, the EUV absorber layer according to the present example comprises 16 atomic percent tin (Sn), 64 atomic percent oxygen (O), two atomic percent carbon (C) as an impurity, and 18 atomic percent indium (In). Advantageously, full photoresist development was observed. Dose lowering was observed for EUV absorber layers comprising more In than Sn. The absorber layers shown in FIG. 5 were advantageously smooth and amorphous, which can facilitate process integration.

FIG. 6 schematically shows a process flow of an embodiment of a method as described herein for making an absorber layer. The method starts 611 when a substrate is positioned on a substrate support in a reaction chamber. The method further comprises a plurality of deposition cycles 617. A deposition cycle 617 comprises a first precursor pulse 612, a first reactant pulse 613, a second precursor pulse 614, and a second reactant pulse 615. The first precursor pulse 612 comprises providing a first precursor to the reaction chamber. The first reactant pulse 613 comprises providing a first reactant to the reaction chamber. The second precursor pulse 614 comprises providing a second precursor to the reaction chamber. The second reactant pulse 615 comprises providing a second reactant to the reaction chamber. After a pre-determined amount of deposition 617 have been carried out, the method ends 616.

It shall be understood that the first precursor and the second precursor are different. It shall be further understood that the first reactant and the second reactant can be different, or can be identical. It shall be further understood that suitable first precursors include precursors as described herein. It shall be further understood that suitable second precursors include precursors as described herein. It shall be further understood that suitable first reactants include reactants as described herein. It shall be further understood that suitable second reactants include reactants as described herein.

It shall be understood that various modifications of a deposition cycle 617 are possible. For example, a deposition cycle can comprise a single precursor pulse and a single reactant pulse, in which the first precursor and the second precursor are simultaneously provided to the reaction chamber. In another embodiment, a deposition cycle can comprise a first precursor pulse, a second precursor pulse, and a single reactant pulse. Suitably, the first precursor pulse and the second precursor pulse can be executed consecutively.

In an exemplary embodiment of a process according to FIG. 6, the first precursor is a tin precursor, the second precursor is an indium precursor, the first reactant is an oxygen reactant, and the second reactant is an oxygen reactant. In some embodiments, the first reactant and the second reactant are identical. In some embodiments, the first reactant and the second reactant are different.

FIG. 7 shows another embodiment of a method for making an absorber layer, as described herein. The method starts 711 with providing a substrate to a reaction chamber. The method further comprises a plurality of deposition cycles 714. A deposition cycle 714, i.e. ones from the plurality of deposition cycles, comprises a precursor pulse 712 and a reactant pulse 713. The precursor pulse 712 comprises providing a precursor to the reaction space. The reactant pulse 713 comprises providing a reactant to the reaction chamber. After a pre-determined amount of deposition 714 have been carried out, the method ends 715.

In an exemplary embodiment of a method according to FIG. 7, a germanium (Ge) and tellurium (Te)-containing layer can be formed. In such embodiments, the precursor can be a germanium precursor and the reactant can be a tellurium reactant. FIG. 8 shows experimental contrast curves for such samples having several thicknesses, in particular thicknesses of 3, 7.5, and 15 nm. Advantageously, absorber layers having a thickness of 7.5 nm and those having a thickness of 15 nm show a reduction of the dose at which full exposure occurs.

In another exemplary embodiment of a method according to FIG. 7, an antimony (Sb) and tellurium (Te)-containing layer can be formed. In such embodiments, the precursor can be an antimony precursor and the reactant can be a tellurium reactant. FIG. 9 shows experimental contrast curves for such samples having several thicknesses, in particular thicknesses of 2, 3.4, and 6 nm. Advantageously, absorber layers having a thickness of 6 nm show a reduction of the dose at which full exposure occurs.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

We claim:

1. A method of forming an extreme ultraviolet (EUV) absorber layer on a surface of a substrate, the method comprising the steps of:

providing a substrate within a reaction space of a gas-phase reactor;

providing a precursor to the reaction space;

providing a reactant to the reaction space; and forming an absorber layer on a surface of the substrate within the reaction space, the absorber layer comprising at least two elements having an EUV cross section (a) of greater than $2\times10^6$ $cm^2$/mol, wherein the absorber layer comprises two or more elements selected from the group consisting of Al, Mg, Ti, Y, La, Sr, Tb, Yb, Ge and Ir, wherein the absorber layer comprises a metal halide, wherein the precursor is a metal precursor, and wherein the reactant comprises a halogen.

2. The method of claim 1, wherein the EUV cross section ($\sigma_\alpha$) is greater than an EUV cross section ($\sigma_\alpha$) of oxygen.

3. A method of forming an extreme ultraviolet (EUV) absorber layer on a surface of a substrate, the method comprising the steps of:

providing a substrate within a reaction space of a gas-phase reactor;

providing a precursor to the reaction space;

providing a reactant to the reaction space; and forming an absorber layer on a surface of the substrate within the reaction space, the absorber layer comprising at least two elements having an EUV cross section (0%) of greater than $2\times10^6$ $cm^2$/mol, wherein the reactant is selected from the group consisting of HF, $TiF_4$, and HFac, wherein the absorber layer comprises a metal halide, and wherein the precursor is a metal precursor.

4. The method of claim 1, wherein the metal halide comprises a transition metal halide or a lanthanide metal halide.

5. The method of claim 1, wherein the metal halide comprises one or more of a metal iodide and a metal fluoride.

6. The method of claim 1, wherein the metal-halide comprises one or more of $PbI_2$, $PbF_2$, CsF, $BiF_3$, $InF_3$, $AlF_3$, $MgF_2$, $TiF_3$, $YF_3$, $LaF_3$, $SrF_2$, $TbF_3$, $YbF_3$, $HfF_4$, $AlO_xF_y$, $AlW_xF_y$, $LiAl_xF_y$, $CaF_2$, $MnF_2$, $ZnF_2$, $ZnO_xF_y$, $ZrF_4$, or CsI, where x and y are integers ≥1.

7. The method of claim 1, wherein at least one of the at least two elements has an EUV cross section ($\sigma_\alpha$) of greater than $1\times10^7$ $cm^2$/mol.

8. The method of claim 1, wherein the absorber layer comprises two or more elements selected from the group consisting of Al, Mg, Ti, Y, La, Sr, Tb, Yb, or Ge.

9. The method according to claim 1, wherein forming the absorber layer comprises executing a cyclical deposition process, the cyclical deposition process comprising a plurality of deposition cycles.

10. The method according to claim 1, wherein the absorber layer consists essentially of a metal fluoride.

11. The method according to claim 1, wherein the absorber layer comprises tellurium.

12. The method according to claim 1, wherein the absorber layer comprises germanium and tellurium.

13. A method of forming an extreme ultraviolet (EUV) absorber layer on a surface of a substrate, the method comprising the steps of:

providing a substrate within a reaction space of a gas-phase reactor;

providing a precursor to the reaction space;

providing a reactant to the reaction space;

forming an absorber layer on a surface of the substrate within the reaction space, the absorber layer comprising at least two elements having an EUV cross section (Ca) of greater than $2\times10^6$ $cm^2$/mol; and forming a capping layer overlying the absorber layer, the capping layer comprising a metal oxycarbide, wherein the absorber layer comprises a metal halide, wherein the precursor is a metal precursor, and wherein the reactant comprises a halogen.

14. The method of claim 1, further comprising a step of forming a resist on the absorber layer.

15. A structure for forming patterned features using extreme ultraviolet (EUV) radiation, the structure comprising:

a substrate comprising a semiconductor device substrate; and an absorber layer formed overlying the substrate, wherein the absorber layer comprises a material represented by the formula MNx, where M is selected from one or more of Sb, Sn, In, Bi, Ag, Pt, Ir, Pb, Au, Yb, and Cs; where N is selected from one or more of I, Te, and Sb; and where x ranges from 0.1 to 4; and a capping layer overlying the absorber layer, the capping layer comprising a metal oxycarbide.

16. The method of claim 13, wherein the capping layer comprises amorphous carbon and the metal oxycarbide.

17. The method of claim 15, wherein the capping layer comprises amorphous carbon and the metal oxycarbide.

18. The method according to claim 13, wherein the absorber layer comprises tellurium.

19. The method according to claim 13, wherein the absorber layer comprises germanium and tellurium.

20. The method of claim 15, where x ranges from 2 to 4.

21. The method of claim 15, wherein the absorber layer comprises a material selected from the group consisting of $Sb_2Te_3$, $PbI_2$, CdTe, and CsI.

* * * * *